United States Patent [19]

Nagashima et al.

[11] Patent Number: 6,101,316
[45] Date of Patent: Aug. 8, 2000

[54] EVAPORATION APPARATUS, ORGANIC MATERIAL EVAPORATION SOURCE, AND METHOD OF MANUFACTURING THIN ORGANIC FILM

[75] Inventors: Naoki Nagashima; Natsuki Takahashi; Toshio Negishi; Izumi Kashiwabara, all of Chigasaki, Japan

[73] Assignee: Nihon Shinku Gijutsu Kabushiki Kaisha, Chigasaki, Japan

[21] Appl. No.: 09/088,088

[22] Filed: Jun. 1, 1998

[51] Int. Cl.$^7$ ............... C23C 14/00; C23C 16/00; F22B 1/28; C10K 15/00
[52] U.S. Cl. ........... 392/388; 392/400; 118/723 VE; 261/133
[58] Field of Search ............ 392/394, 396, 392/386, 389, 400; 118/715, 723 VE, 724, 726, 50; 261/133, 134, 142; 427/592, 255.11, 255.12

[56] References Cited

U.S. PATENT DOCUMENTS

| | | | |
|---|---|---|---|
| 1,715,035 | 5/1929 | Hoyt | 219/439 |
| 3,108,014 | 10/1963 | Gellar | 118/715 |
| 3,252,830 | 5/1966 | Cummin et al. | 117/217 |
| 3,392,051 | 7/1968 | Caswell et al. | 117/212 |
| 3,583,685 | 6/1971 | Boerger et al. | 261/128 |
| 4,116,016 | 9/1978 | Roop et al. | 392/400 |
| 4,436,674 | 3/1984 | McMenamin | 118/726 |
| 4,500,562 | 2/1985 | Jahn et al. | 427/27 |
| 4,536,271 | 8/1985 | Collins | 204/192 |
| 4,640,221 | 2/1987 | Barbee et al. | 118/715 |
| 4,683,143 | 7/1987 | Riley | 427/8 |
| 4,783,343 | 11/1988 | Sato | 118/726 |
| 5,279,129 | 1/1994 | Ito | 62/50.2 |
| 5,832,177 | 11/1998 | Shinagawa et al. | 392/394 |

FOREIGN PATENT DOCUMENTS

| | | |
|---|---|---|
| 1434575 | 2/1966 | France . |
| 2 297 900 | 8/1976 | France . |
| 2 476 142 | 8/1981 | France . |

OTHER PUBLICATIONS

Usui et al., *Anthracene and polyethylene thin film depositions by ionized cluster beam*, American Vacuum Society, Vo. 4., No. 1, Jan./Feb. 1986, pp. 52–60.

European Search Report for European Application No. 98109760.3–2307 dated Oct. 27, 1998.

*Primary Examiner*—Sang Paik
*Attorney, Agent, or Firm*—Armstrong, Westerman, Hattori, McLeland & Naughton

[57] ABSTRACT

An inactive gas is introduced into an organic material evaporation source to place a thin organic film material in the organic material evaporation source in an atmosphere having a relatively high pressure, and the temperature of the thin organic film material is increased up to a certain temperature. Then, the organic material evaporation source is evacuated to lower the pressure around the thin organic film material for thereby causing the thin organic film material to emit a vapor. Since no wasteful vapor is emitted from the thin organic film material, the thin organic film material is effectively utilized. Because the inactive gas acts as a heating medium, the temperature of the thin organic film material is increased at a high rate, and the thin organic film material is uniformly heated. When the temperature of the thin organic film material is lowered in an inactive gas atmosphere, it can be lowered at a high rate. The inactive gas is introduced directly into the organic material evaporation source by an on-off valve, the time required to evacuate the organic material evaporation source is reduced. A liquid thin organic film material may be heated by a heating medium in the organic material evaporation source, so that the liquid thin organic film material will not be heated to a temperature higher than the temperature of the heating medium, and hence will not suffer bumping due to a temperature overshooting.

11 Claims, 8 Drawing Sheets

EVAPORATION APPARATUS, ORGANIC MATERIAL EVAPORATION SOURCE, AND METHOD OF MANUFACTURING THIN ORGANIC FILM

BACKGROUND OF THE INVENTION

1. Field of the Invention

The present invention relates to an evaporation apparatus for forming a thin organic film on an object, an organic material evaporation source for use in such an evaporation apparatus, and a method of manufacturing a thin organic film.

2. Description of the Related Art

The conventional electronic material technology has primarily focused on inorganic materials including semiconductors. However, recent years have seen more attention drawn to functional thin organic films of organic compounds as electronic materials.

Organic compounds are advantageous for use as electronic materials because they provide more diverse reactions and properties than inorganic materials and can be surface-treated with lower energy than inorganic materials.

Functional thin organic films are used in organic electroluminescence devices, piezoelectric sensors, pyroelectric sensors, electric insulating films, etc. Electroluminescence devices can be used as display panels, and efforts are being made to develop a technique capable of forming a thin organic film uniformly on a large substrate for producing an electroluminescence display device with a large display area.

Conventional thin organic film fabrication processes employ vacuum evaporation apparatus primarily designed for forming thin metal films including thin films of Al and $SiO_2$, and thin organic films. Evaporation apparatus designed for the fabrication of thin organic films have not yet been developed in the art.

Thin organic film materials have features of their own in contrast to thin inorganic film materials as described below.

Thin organic film materials have high vapor pressures. While metal evaporation sources have an evaporation temperature ranging from 600° C. to 2000° C., thin organic film materials have a lower evaporation temperature ranging from 0° C. (often sub-zero temperatures) to 400° C. Many thin organic film materials tend to be decomposed in a temperature range from 20° C. to 400° C. Therefore, it is preferable to effect precise temperature control for evaporating thin organic film materials.

When a thin metal film is to be fabricated, an electron beam evaporation apparatus is used to apply an electron beam to a metal evaporation source. However, if an electron beam is applied to a thin organic film material, the thin organic film material will be decomposed because the energy of the electron beam is too high for the thin organic film material.

Some thin organic film materials are powdery in nature. Generally, powdery materials have poor thermal conductivity. When a powdery material is heated in a vacuum, its temperature cannot easily be raised or lowered due to the heat insulating effect of the vacuum, and the actual temperature of the powdery material may be delayed with respect to a target temperature at which the powdery material is to be controlled.

Once the temperature of a powdery evaporation source is raised, the powdery evaporation source cannot quickly be cooled by radiation only. Therefore, the material evaporation from the powdery evaporation source is not finished immediately when the heating of the powdery evaporation source is stopped. The material evaporation cannot thus be controlled sharply.

Inasmuch as thin organic film materials have high vapor pressures, absorbs on the wall of a vacuum chamber at a low temperature are likely to be released (reevaporated) as the temperature of the vacuum chamber rises. If such released particles find their way into a thin organic film formed on an object, then they tend to degrade characteristics of the thin organic film.

Many thin organic film materials are capable of easily absorbing moisture. Some of them have their properties modified when they absorb moisture. If moisture is trapped into a multilayer thin organic film as it is formed, then properties of the interlayer boundaries are modified. Such property modifications are liable to result in defects in the final performance of functional devices including electroluminescence devices, piezoelectric sensors, and pyroelectric sensors.

Metal evaporation sources exhibits directivity upon evaporation. The movement of vapor from metal evaporation sources is substantially straight therefrom according to the cosine law. The movement of some thin organic film materials vapor, however, is curved like the direction of particle motion due to diffusion.

For forming an evaporated polymeric film, it is necessary that the composition ratio of two thin organic film materials to be evaporated at the same time be in accordance with a stoichiometric ratio. If the composition ratio differs from a stoichiometric ratio, then a fabricated piezoelectric or pyroelectric device, for example, will lose its functions or suffer function degradation. Film growth speeds need to be precisely controlled for equalizing composition ratio to a stoichiometric ratio.

As described above, thin organic film materials have many properties which make themselves difficult to handle with ease.

FIGS. 8A through 8E of the accompanying drawings show various conventional evaporation sources. These illustrated evaporation sources, however, are not suitable for use with thin organic film materials because of the above properties of thin organic film materials and demanded properties of thin organic films.

FIG. 8A shows a direct resistance heating evaporation source including an evaporation source container 101 of metal which is heated by an electric current passing directly therethrough for evaporating a thin film material.

The direct resistance heating evaporation source provides excellent temperature stability in a temperature range in which metals are melted. However, it has poor temperature stability and controllability in a temperature range in which thin organic film materials are evaporated, with the result that an organic compound vapor (the vapor of a thin organic film material) will be produced at an unstable rate.

Some thin organic film materials have an ability to corrode or react with metals. Those thin organic film materials cannot be used with the evaporation source container 101 which is made of metal.

FIG. 8B shows a conical-basket evaporation source having an evaporation source container 111 and a resistance heater 112 disposed around the evaporation source container 111. When the resistance heater 112 is energized, it indirectly heats a thin film material in the evaporation source container 111 to evaporate the thin film material.

FIG. 8C shows a Knudsen-cell evaporation source having an evaporation source container 121 and a resistance heater 122 disposed around the evaporation source container 121. When the resistance heater 122 is energized, it indirectly heats a thin film material in the evaporation source container 121 to evaporate the thin film material.

Each of the evaporation sources shown in FIGS. 8B and 8C provides excellent temperature stability in a temperature range in which metals are melted. However, it has poor temperature stability and controllability in a temperature range in which thin organic film materials produce vapor, with the result that an organic compound vapor (the vapor of a thin organic film material) will be produced at an unstable rate.

The resistance heater 112 usually comprises a bare metal wire. The movement of thin organic film materials vapor is more likely to be curved than that of thin inorganic film materials. If a thin organic film material contains a metal chelate or the like, it may develop a short circuit between turns of the resistance heater 112.

Because the Knudsen-cell evaporation source is of a complex structure, it cannot easily be cleaned, and the thin film material cannot fully be removed from the Knudsen-cell evaporation source after an evaporation process. Therefore, when the thin film material in the evaporation source container 121 is replaced with another thin film material, the new thin film material may possibly be contaminated with a residue of the previous thin film material.

FIG. 8D shows a lamp-heater type evaporation source comprising an evaporation source container 131 made of a light-transmissive material such as quartz and an infrared lamp 133 disposed above the evaporation source container 131. The infrared lamp 133 applies radiant heat to the evaporation source container 131 to evaporate a thin film material in the evaporation source container 131.

The lamp-heater type evaporation source has excellent temperature controllability at low temperatures. However, since the evaporation source container 131 has a large specific heat capacity, there tends to be developed a difference between the a target temperature at which the thin film material is to be controlled and an actual temperature of the thin film material. If the temperature of the thin film material is measured for being controlled, a temperature overshooting tends to occur, decomposing a thin organic film material placed in the evaporation source container 131.

The evaporation source container 131 needs to be made of a transparent material such as quartz or the like in order to allow radiant heat emitted from the infrared lamp 133. However, the transparent material is apt to be damaged when it is cleaned or replaced.

After the evaporation source container 131 has been used for a long period of time, it is irregularly fogged and transmits different infrared intensities at different positions. Such different infrared intensities cause a thin organic film material, which has poor thermal conductivity, placed in the evaporation source container 131 to be overheated locally.

Some thin organic film materials are modified by light at a certain wavelength. Such thin organic film materials cannot be evaporated by the lamp-heater evaporation source shown in FIG. 8D.

FIG. 8E shows an electron beam gun evaporation source which applies an electron beam 145 to a thin film material to evaporate the thin film material. The electron beam gun evaporation source shown in FIG. 8E, however, cannot be used to evaporate thin organic film materials because the electron beam 145 decomposes thin organic film materials when applied to them.

As described above, the conventional evaporation sources shown in FIGS. 8A through 8E will suffer various problems if applied to the evaporation of thin organic film materials. Particularly, the decomposition of thin organic film materials due to a temperature overshooting and the difficulty in heating thin organic film materials are problems that have not been experienced with thin inorganic film materials, and should be alleviated.

SUMMARY OF THE INVENTION

It is therefore an object of the present invention to provide an evaporation apparatus which is capable of increasing the temperature of an organic film material in a short period of time up to a desired temperature without causing a temperature overshooting and thermally decomposing main constituents of the organic film material.

Another object of the present invention is to provide an evaporation apparatus which is capable of preventing an organic film material from producing a vapor except when the organic film material is evaporated, for thereby effectively exploiting the organic film material from.

Still another object of the present invention is to provide an organic material evaporation source which can uniformly heat a liquid organic film material up to a constant temperature, and allows such a liquid organic film material to be handled with ease.

Yet still another object of the present invention is to provide a method of manufacturing an organic film with such an evaporation apparatus or an organic material evaporation source.

According to the present invention, there is provided an evaporation apparatus comprising a vacuum chamber for holding therein an object on which an organic film is to be formed, an evacuating system connected to the vacuum chamber, for evacuating the vacuum chamber, an organic material evaporation source disposed in the vacuum chamber, for containing an organic film material, and having temperature control means for controlling the temperature of the organic film material to evaporate the organic film material for forming an organic film on the object held in the vacuum chamber, and a gas supply system connected to the vacuum chamber, for introducing an inactive gas into the vacuum chamber.

After the vacuum chamber is evacuated, an inactive gas is introduced into the vacuum chamber to place the organic film material in the organic material evaporation source in an inactive gas atmosphere. When the temperature of the organic film material is controlled, the inactive gas produces a convective flow around the organic film material, with the result that the rate at which the temperature of the organic film material is increased or reduced is higher than if the organic film material were placed in a vacuum atmosphere. If the organic film material is powdery, the inactive gas enters between particles of the powdery organic film material and acts as a heating medium, increasing the heat transfer coefficient between the particles of the powdery organic film material. Therefore, the temperature controllability of the organic film material is increased, preventing the organic film material from suffering localized overheating and a temperature overshooting, so that the organic film material is prevented from being decomposed.

An organic material evaporation source according to the present invention comprises a container for containing a organic film material therein, an outlet port, and an on-off valve connected between the container and the outlet port, the on-off valve being openable for connecting an interior atmosphere in the container to an exterior atmosphere outside of the container through the outlet port, and closable for disconnecting the interior atmosphere in the container from the exterior atmosphere outside of the container.

After an inactive gas is introduced into a vacuum chamber connected to the organic material evaporation source, the on-off valve is closed to place the organic film material in an inactive gas atmosphere.

Generally, an organic compound emits a less vapor in an inactive gas atmosphere than in a vacuum atmosphere. Therefore, when the organic film material is heated and cooled in the inactive gas atmosphere, the emission of a vapor from the organic film material is suppressed during that time. Accordingly, any wasteful vapor that would not contribute to the formation of an organic film is not emitted from the organic film material. The organic film material is thus effectively utilized, and the cost of a manufactured organic film is lowered.

When the organic film material is heated to a temperature at which it would be evaporated in the vacuum atmosphere, the organic film material may be prevented from being evaporated in the inactive gas atmosphere depending on the pressure of the inactive gas atmosphere. Therefore, when the vacuum chamber is evacuated after the temperature of the organic film material is increased in the inactive gas atmosphere, an organic film can be formed without the emission of a wasteful vapor from the organic film material.

The organic material evaporation source further comprises a gas supply system connected to the container, for selectively introducing a gas into the container while the on-off valve is being closed. The organic film material can thus be placed in an inactive atmosphere while the vacuum atmosphere is being developed in the vacuum chamber.

It is therefore not necessary to introduce an inactive gas into the vacuum chamber which is of a large volume in order to suppress the emission of a vapor from the organic film material.

The organic material evaporation source further comprises an evacuating system connected to the container, for selectively evacuating the container while the on-off valve is being closed. The on-off valve can be opened after the container is evacuated to discharge the gas. The organic material evaporation source further comprises a gas supply system connected to the container, for selectively introducing a gas into the container while the on-off valve is being closed.

The organic film material tends to be separated from the vapor when it is cooled. The organic material evaporation source preferably further comprises heating means disposed between the container and the outlet port across the on-off valve, for heating a passage from the container to the outlet port across the on-off valve. The heating means serves to prevent a vapor emitted from the organic film from being cooled until the vapor is discharged from the outlet port into the vacuum chamber.

According to the present invention, an organic material evaporation source comprises a container for containing a liquid organic film material therein, and a heating medium circulatory path for passing a heating medium therethrough, the heating medium circulatory path being disposed around the container. Since the container can be heated or cooled uniformly by the heating medium, the ability for the liquid organic film material to be uniformly heated is increased.

The organic material evaporation source further comprises a heating medium source for controlling the temperature of the heating medium to heat or cool the liquid organic film material contained in the container. Because of a heat exchange between the liquid organic film material and the heating medium, it is possible to increase or reduce the temperature of the liquid organic film material with accuracy. When the temperature of the liquid organic film material is to be increased, since it will not be higher than the temperature of the heating medium, the liquid organic film material is prevented from being locally overheated.

As the liquid organic film material is not heated by heat radiation, its heating will not be made irregular by frosted regions of the container. Because the container is not required to be transparent, it may be made of a ceramic material having a high heat transfer coefficient, and hence can be handled with ease.

The organic material evaporation source further comprises a casing disposed around the container, the heating medium circulatory path being defined between the container and the casing. Inasmuch as a heat exchange occurs between the organic film material and the heating medium through the wall of the container, the efficiency of the heat exchange is high, resulting in increased temperature controllability.

The organic material evaporation source further comprises a heat insulating member disposed around the casing for higher thermal efficiency and temperature controllability.

Alternatively, the organic material evaporation source further comprises a casing disposed around the container, the heating medium circulatory path being defined between the container and the casing, and a heating medium source for controlling the temperature of the heating medium to heat or cool the liquid organic film material contained in the container.

As described above, the rate at which a vapor is emitted from an organic film material varies depending on the pressure of an atmosphere around the organic film material. According to the present invention, there is also provided a method of manufacturing an organic film by emitting a vapor from an organic film material placed in an organic material evaporation source to form an organic film on an object, comprising the step of controlling the pressure of an atmosphere around the organic film material to control the rate at which the vapor is emitted from the organic film material.

According to the present invention, there is further provided a method of manufacturing an organic film by emitting a vapor from an organic film material placed in an organic material evaporation source to form an organic film on an object, comprising the steps of increasing the pressure of an atmosphere around the organic film material to suppress the emission of the vapor from the organic film material when the temperature of the organic film material is increased, and thereafter, reducing the pressure of the atmosphere around the organic film material to start emitting the vapor from the organic film material.

When the pressure of the atmosphere is increased at the time the temperature of the organic film material is increased, the temperature uniforty of the organic film material is increased, shortening the time required to heat the organic film material to increase its temperature up to a desired temperature. When the pressure of the atmosphere is then reduced, the organic film material immediately starts emitting a vapor. Consequently, the time required to form an organic film from the vapor of the organic film material is reduced.

As described above, the organic film material can start and stop emitting a vapor simply by controlling the degree of vacuum of the atmosphere around the organic film material after the temperature of the organic film material is increased. Therefore, any wasteful emission of the vapor of the organic film material which is expensive is prevented.

The step of increasing the pressure of the atmosphere around the organic film material comprises the step of introducing an inactive gas into the atmosphere around the organic film material. The pressure of the atmosphere may be reduced by evacuating the gas.

The method further comprises the step of increasing the pressure of the atmosphere around the organic film material to stop emitting the vapor from the organic film material.

Since the emission of the vapor is immediately stopped, the evaporation of the organic film material can be controlled sharply, and any wasteful emission of the vapor of the organic film material which is expensive is prevented. For cooling the organic film material after an organic film has been formed, the organic film material may be placed in an atmosphere having a high pressure to increase the rate at which the organic film material is cooled.

Experiments have confirmed that when an organic film material is heated to a temperature at which it emits a vapor in a low-pressure atmosphere, the organic film material does not emit a vapor if the pressure of the atmosphere around the organic film material is increased to a range from 13.3 Pa (0.1 Torr) to $2.0 \times 10^3$ Pa (15.0 Torr) depending on the type of the organic film material.

If the pressure of the atmosphere were too high, the amount of an inactive gas used would be increased, and the time required to evacuate the inactive gas to lower its pressure would also increased. Therefore, it is preferable to set the pressure to 66.5 Pa (0.5 Torr) for suppressing the emission of a vapor.

After the temperature of the organic film material is increase in such a high-pressure atmosphere, the inactive gas is evacuated to develop a low-pressure atmosphere to allow the organic film material to emit a vapor. For increasing the quality of an organic film to be formed, it is preferable to lower the pressure of the atmosphere to $1.33 \times 10^{-4}$ Pa ($1.0 \times 10^{-6}$ Torr) or less, or more preferably to $1.33 \times 10^{-5}$ Pa ($1.0 \times 10^{-7}$ Torr) or less.

The method further comprises the steps of, before the temperature of the organic film material is increased, reducing the pressure of the atmosphere around the organic film material and increasing the temperature of the organic film material to degas the organic film material. To degas the organic film material, it is preferable to heat the organic film material to a temperature lower than its evaporation temperature.

A method according to claim 13, wherein said step of increasing the pressure of the atmosphere around said organic film material comprises the step of introducing an inactive gas into the atmosphere around said organic film material.

A method according to claim 13, wherein said step of increasing the pressure of the atmosphere around said organic film material comprises the step of introducing an inactive gas into the atmosphere around said organic film material; and comprising the step of reducing the temperature of said organic film material.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 1:
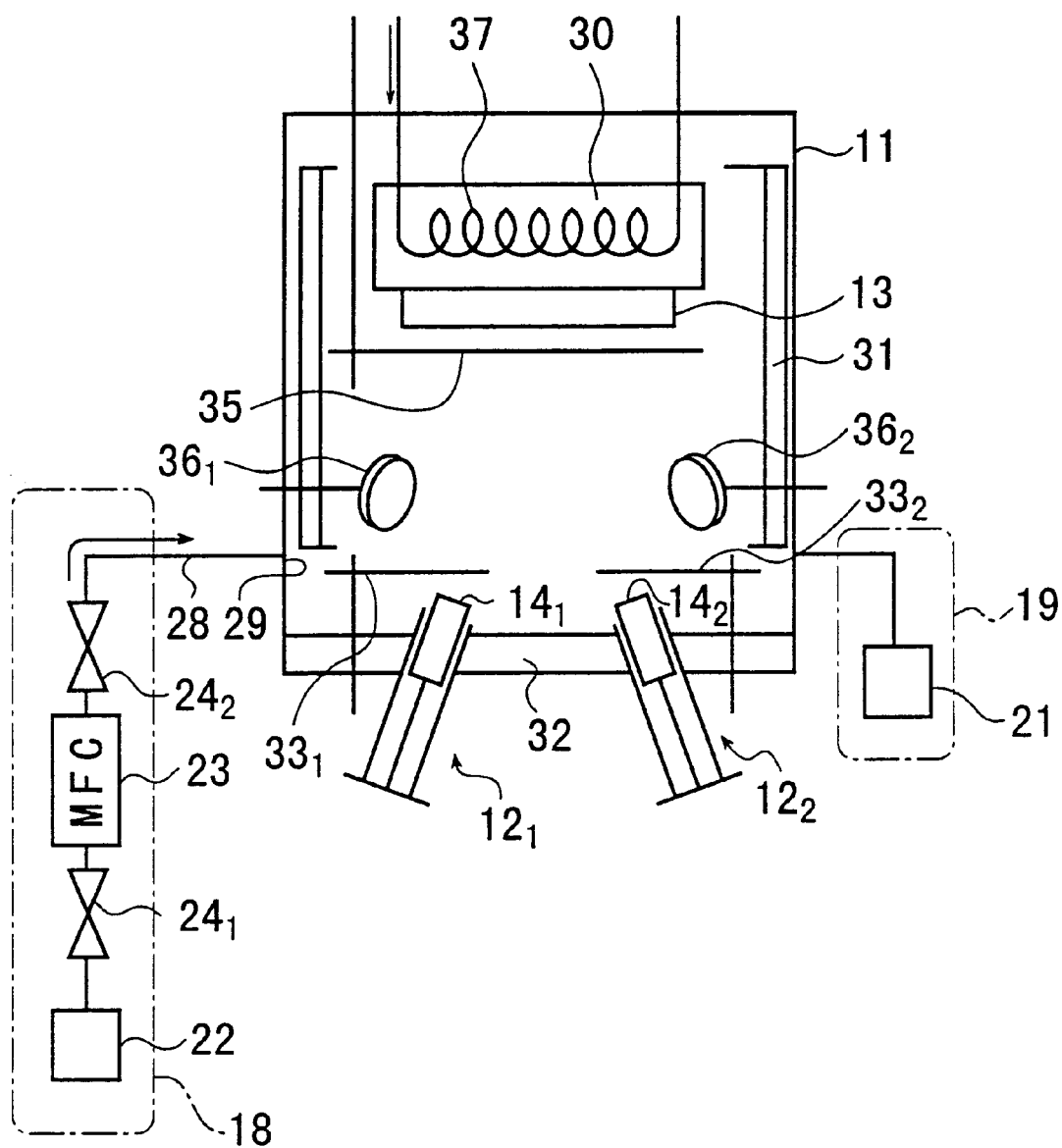
FIG. 1 is a schematic cross-sectional view of an evaporation apparatus according to an embodiment of the present invention.

As shown in FIG. 1a an evaporation apparatus 10 according to an embodiment of the present invention has a vacuum chamber 11 to which there are connected a gas supply system 18 and an evacuating system 19. The evacuating system 19 has a vacuum pump 21 which evacuates the vacuum chamber 11 to a high vacuum when it actuates.

The vacuum chamber 11 has a plurality of organic material evaporation sources disposed on a bottom wall thereof. In FIG. 1, the organic material evaporation sources include two organic material evaporation sources $12_1$, $12_2$. The organic material evaporation sources $12_1$, $12_2$ have respective discharge ports $14_1$, $14_2$. When thin organic film materials are placed in the respective organic material evaporation sources $12_1$, $12_2$ and heated to predetermined temperatures, the thin organic film materials emit vapors of organic compounds, which are discharged (desorbed) through the discharge ports $14_1$, $14_2$ into the vacuum chamber 11.

The vacuum chamber 11 houses therein a substrate holder 30 disposed upwardly of the organic material evaporation sources $12_1$, $12_2$. The substrate holder 30 holds on its lower surface an object 13, i.e., a glass substrate 13, such that a surface of the glass substrate 13 on which a thin organic film is to be deposited faces the discharge ports $14_1$, $14_2$.

The gas supply system 18 comprises a gas pipe 28, a mass flow controller 23, a gas container 22, and two valves $24_1$, $24_2$. The gas pipe 28 has a gas inlet port 29 opening into the vacuum chamber 11. The gas container 22 is connected through the valve $24_1$, the mass flow controller 23, the valve $24_2$, and the gas pipe 28 to the interior atmosphere of the vacuum chamber 11.

The gas container 22 is filled with an inactive gas such as a nitrogen gas, an argon gas, or the like. It is assumed in this embodiment that the gas container 22 is filled with a nitrogen gas. When the valves $24_1$, $24_2$ are opened, the nitrogen gas is introduced at a rate controlled by the mass flow controller 23 into the vacuum chamber 11 through the gas inlet port 29.

The vacuum chamber 11 also houses therein a substrate shutter 35 which can be selectively opened and closed near the surface of the glass substrate 13, and a pair of evaporation source shutters $33_1$, $33_2$ which can be selectively opened and closed near the surface of the respective discharge ports $14_1$, $14_2$ of the organic material evaporation sources $12_1$, $12_2$. When the substrate shutter 35 and the evaporation source shutters $33_1$, $33_2$ are closed, organic compound vapors which are discharged from the discharge ports $14_1$, $14_2$ into the vacuum chamber 11 are prevented from reaching the surface of the glass substrate 13, and hence no thin organic film grows on the glass substrate 13.

Film thickness monitors $36_1$, $36_2$ are disposed above the evaporation source shutters $33_1$, $33_2$, respectively, in positions which do not interfere with organic compound vapors that travel from the discharge ports $14_1$, $14_2$ toward the glass substrate 13. When the evaporation source shutters $33_1$, $33_2$ are opened, organic compound vapors discharged from the discharge ports $14_1$, $14_2$ are deposited to the film thickness monitors $36_1$, $36_2$, which then measure the rate at which a thin organic film is deposited on the surface of the glass substrate 13.

In the vacuum container 11, there are also disposed cooling panels 31, 32, which are hermetically supplied with liquid nitrogen, around the glass substrate 13 and on the bottom wall of the vacuum container 11. When liquid nitrogen is introduced into the cooling panels 31, 32 after the vacuum chamber 11 has been evacuated, the cooling panels 31, 32 efficiently attract water molecules present in the vacuum chamber 11 for thereby removing water molecules from the interior atmosphere of the vacuum chamber 11.

If the cooling panels 31, 32 did not exist, then organic compound vapors attracted to wall surfaces of the vacuum chamber 11 would be released and a thin organic film deposited on the surface of the glass substrate 13 would be contaminated by the released vapor. The cooling panels 31, 32 are effective to trap organic compound vapors directed toward wall surfaces of the vacuum chamber 11 and prevent the trapped organic compound vapors from being released. Therefore, the cooling panels 31, 32 allow a high-quality thin organic film to be deposited on the surface of the glass substrate 13.

The substrate holder 30 has a coiled pipe 37 for passing a heating medium therethrough. When a temperature-controlled heating medium flows through the coiled pipe 37, it heats the glass substrate 13 with good temperature controllability to a temperature ranging from 50° C. to 100° C. while a thin organic film is being deposited on the surface of the glass substrate 13. Since the glass substrate 13 is controlled in temperature, a thin organic film is deposited with good adhesion on the glass substrate 13.

Figure 2:
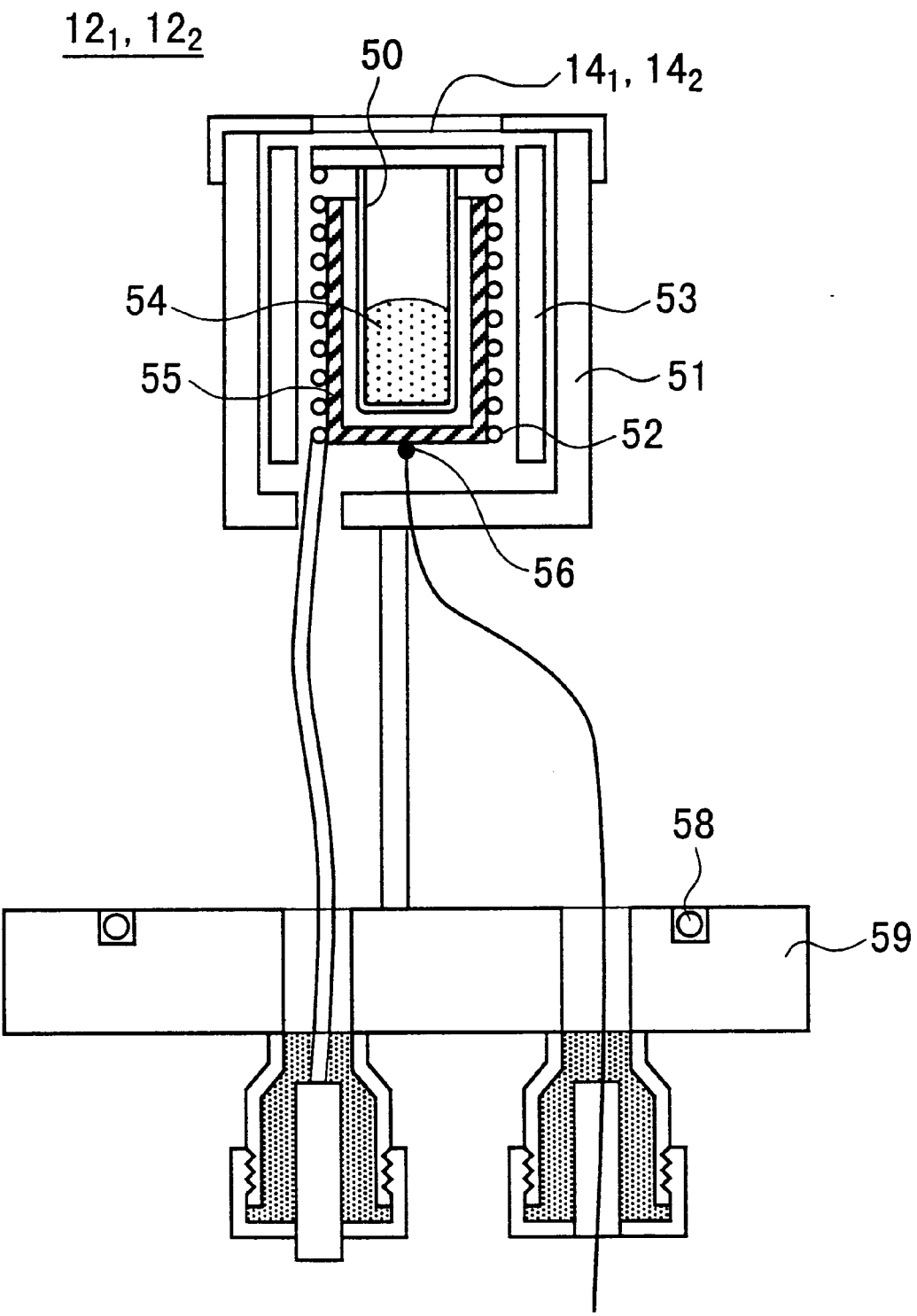
FIG. 2 is a schematic cross-sectional view of an organic material evaporation source used in the evaporation apparatus shown in FIG. 1.

As shown in FIG. 2, each of the organic material evaporation sources $12_1$, $12_2$ is hermetically mounted on the bottom wall of the vacuum chamber 11 by an O-ring 58 and a flange 59. Each of the organic material evaporation sources $12_1$, $12_2$ has a casing 51 including an upper opening toward the vacuum chamber defined therein which serves as one of the discharge ports $14_1$, $14_2$.

The casing 51 houses therein a container 50 for supplying a thin organic film material 54 and a bottomed cylindrical soaking tube 55 disposed around the container 50. A microheater 52 is coiled around the soaking tube 55. The microheater 52 comprises a thin pipe of stainless steel filled with an inorganic insulating material and a resistive heating element such as a nichrome wire placed in the thin pipe.

A thermocouple 56 is mounted on an outer surface of the lower end of the soaking tube 55. When the microheater 52 is energized by a power supply positioned outside of the vacuum chamber 11 while the temperature of the soaking tube 55 is being kept at a predetermined level by the thermocouple 56, the thin organic film material 54 placed in the container 50 is maintained at a desired temperature in the range from 150° C. to 400° C.

A reflector 53 is disposed around the microheater 52 for reflecting radiant heat directed from the microheater 52 toward the casing 51 for thereby efficiently heating the container 50 while minimizing an increase in the temperature of the casing 51.

The microheater 52 has turns which are progressively dense toward the discharge ports $14_1$, $14_2$ and progressively less dense toward the lower closed end of the container 50, so that the temperature of the discharge ports $14_1$, $14_2$ will be higher than those of the container 50 and the thin organic film material 54 placed in the container 50. As a result, a organic compound vapor emitted from the thin organic film material 54 will not be deposited on surfaces near the discharge ports $14_1$, $14_2$.

Figure 4:
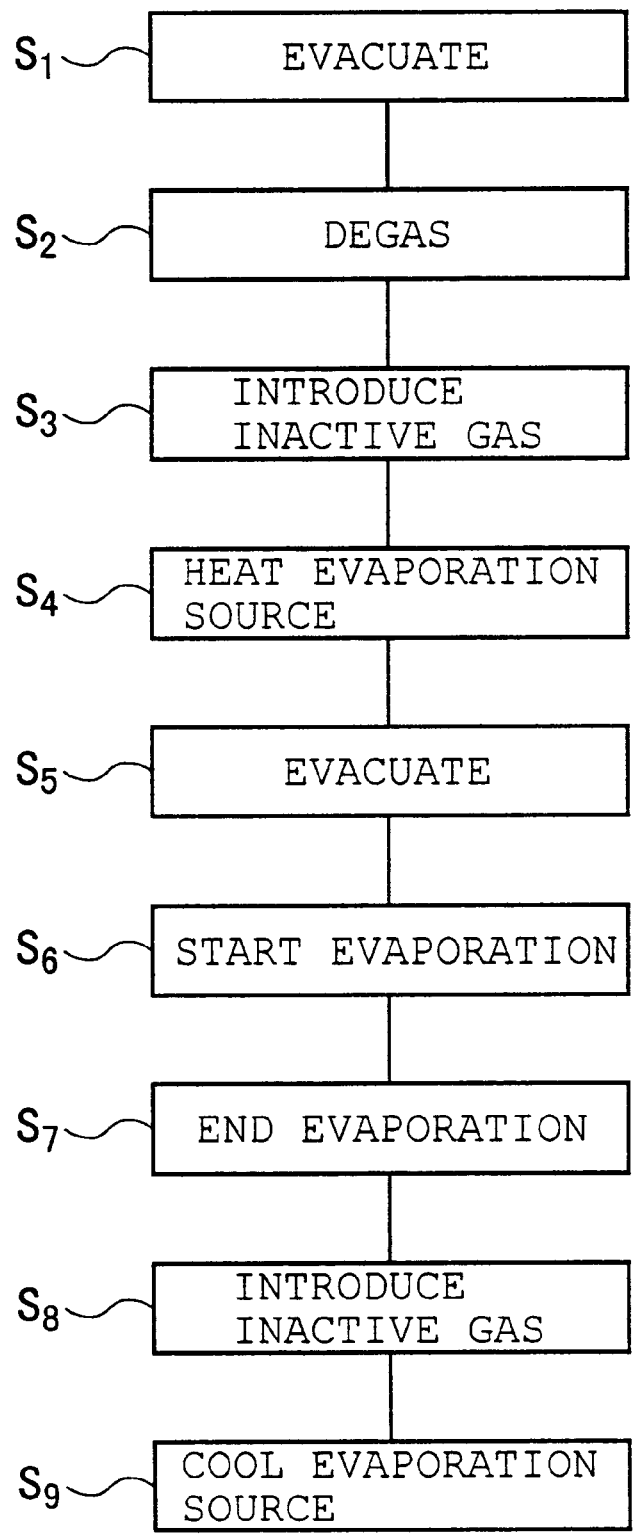
FIG. 4 is a flowchart of a sequence of a method of manufacturing a thin organic film according to the present invention.

A method of manufacturing a thin organic film according to an embodiment of the present invention, using the evaporation apparatus 10 shown in FIGS. 1 and 2, will be described below with reference to FIG. 4.

$Alq_3$ [Tris(8-hydroxyquinoline)aluminum, sublimed] expressed by the following chemical formula:

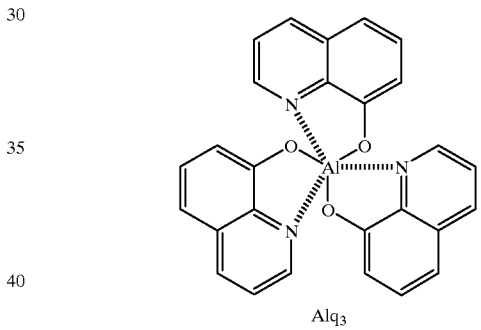

$Alq_3$ is placed as a thin organic film material in one of the organic material evaporation sources $12_1$, $12_2$. The $Alq_3$ is a powdery sublimable thin organic film material.

The vacuum pump 21 is actuated to develop a vacuum atmosphere in the vacuum chamber 11, and the glass substrate 13 is introduced into the vacuum chamber 11. The vacuum chamber 11 is further evacuated to place the $Alq_3$ in the organic material evaporation source $12_1$ and the glass substrate 13 in a vacuum atmosphere having a pressure of $1.0 \times 10^{-6}$ Torr in STEP S1 (see FIG. 4).

Then, the microheater 52 in the organic material evaporation source $12_1$ is energized to heat the $Alq_3$ to a temperature ranging from 100° C. to 200° C. At this temperature, the amount of a vapor emitted from the $Alq_3$ is small, but an adsorbed gas is discharged.

The $Alq_3$ is degassed for a period of time ranging from 20 minutes to 30 minutes in STEP S2, after which a nitrogen gas is introduced as an inactive gas from the gas inlet port 29 into the vacuum chamber 11 in STEP S3 while the vacuum chamber 11 is being evacuated.

When the vacuum chamber 11 and the organic material evaporation source $12_1$ are filled with an inactive gas atmosphere having a pressure of 13.3 Pa (0.1 Torr), the current supplied to the microheater 52 is increased to increase the temperature of the $Alq_3$ in the organic material evaporation source $12_1$ to an evaporating temperature (about 300° C. for the $Alq_3$) in STEP S4. As the temperature rises, since the $Alq_3$ is placed in the inactive gas atmosphere, the heat is efficiently transferred between particles of the $Alq_3$. Therefore, no temperature overshooting occurs, and no vapor of the $Alq_3$ is observed.

When the $Alq_3$ is stabilized at its evaporating temperature, the ingress of the inactive gas is stopped, and the vacuum chamber 11 is evacuated again to a vacuum atmosphere having a pressure of $1.33 \times 10^{-4}$ Pa ($1.0 \times 10^{-6}$ Torr) in STEP S5.

When the $Alq_3$ is stabilized under the vacuum pressure, the evaporation source shutter $33_1$. is opened while the substrate shutter 35 is being closed, discharging an Alq vapor from the discharge port $14_1$.

The $Alq_3$ vapor reaches the film thickness monitor $36_1$, forming a thin organic film on its surface. The rate of growth of the thin organic film is measured. When the measured rate of growth is stabilized, the substrate shutter 35 is opened, starting to form a thin organic film of $Alq_3$ on the surface of the glass substrate 13 in STEP S6.

The thin organic film of $Alq_3$ is formed on the surface of the glass substrate 13 for 5 minutes. When the thickness of the thin organic film of $Alq_3$ on the surface of the glass substrate 13 has reached a predetermined value, the substrate shutter 35 and the evaporation source shutter $33_1$ are closed, and the microheater 52 is de-energized, thus completing the evaporation process in STEP S7.

Thereafter, an inactive gas is introduced from the gas inlet port 29 into the vacuum chamber 11 to place the $Alq_3$ in the organic material evaporation source $12_1$ in an inactive gas atmosphere having a pressure of 13.3 Pa (0.1 Torr), thereby stopping the evaporation of the $Alq_3$ in STEP S8. Since the inactive gas acts as a heating medium and a convective flow is produced, the $Alq_3$ is cooled quickly in STEP S9.

Figure 5:
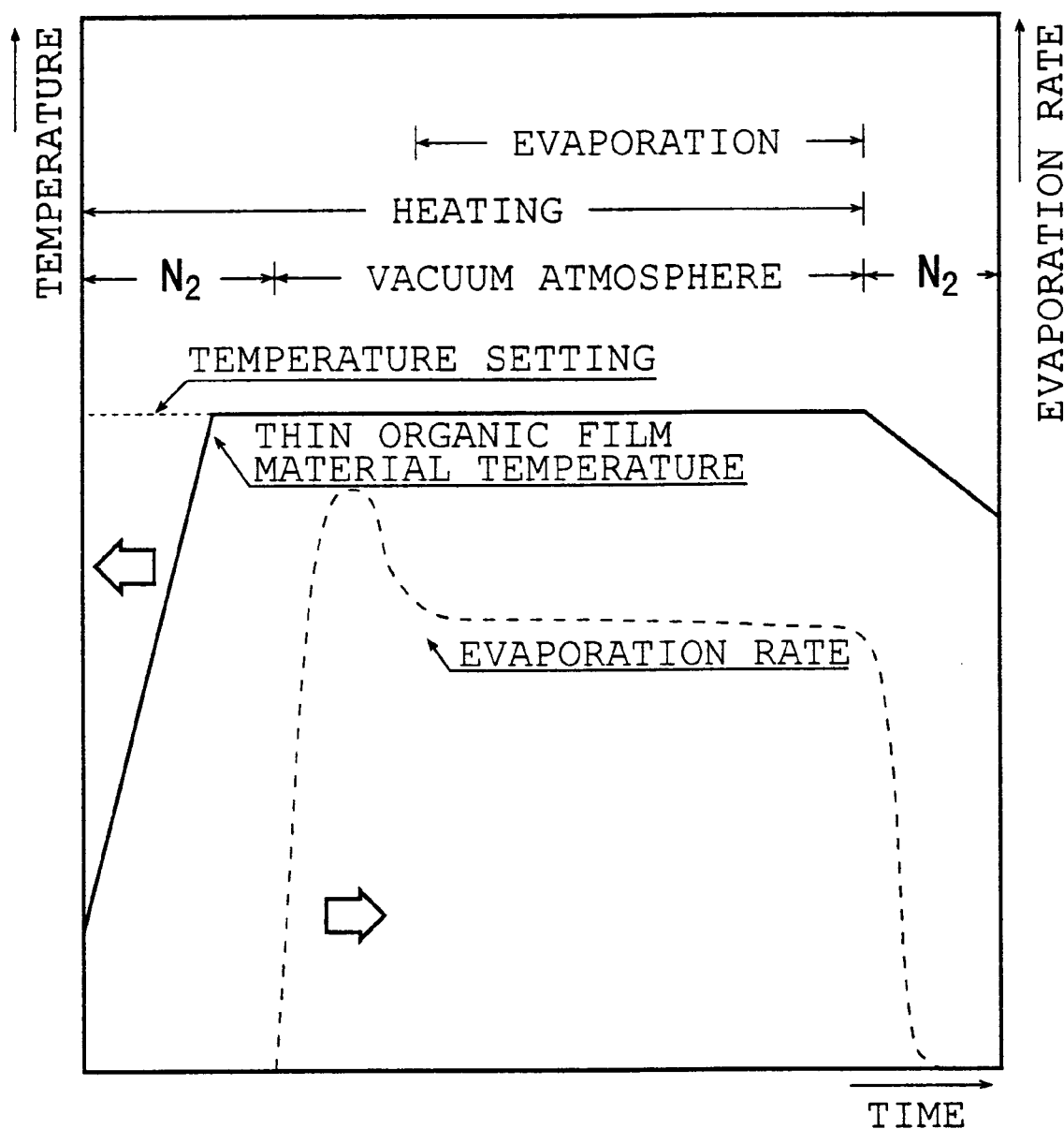
FIG. 5 is a graph showing the manner in which the temperature of a thin organic film material and the evaporation rate thereof vary with time when a thin organic film is formed by the method according to the present invention.
Figure 6:
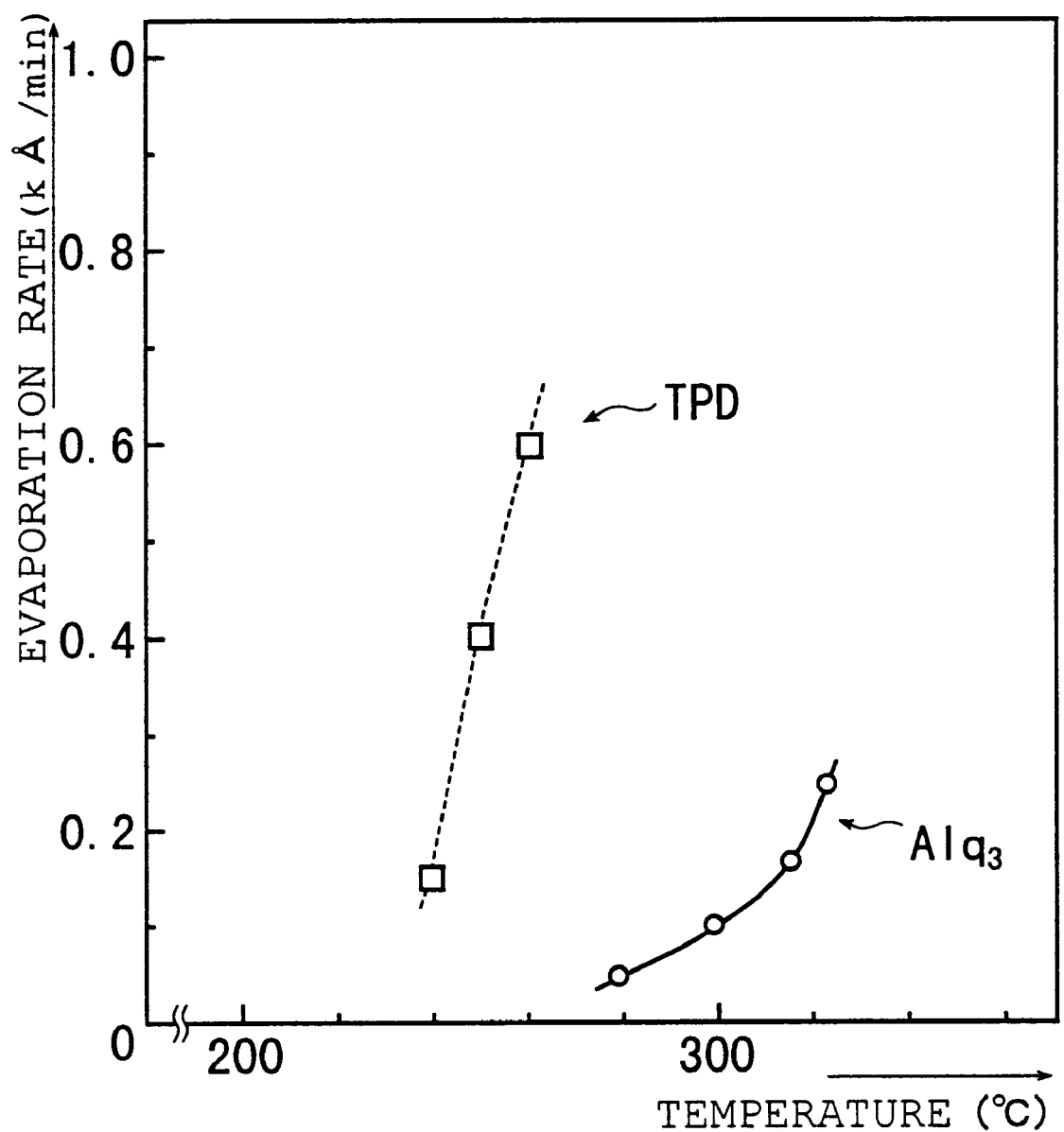
FIG. 6 is a graph showing the relationship between the temperature and evaporation ratio of $Alq_3$ and TPD.

FIG. 5 shows the manner in which the temperature of the $Alq_3$ and the evaporation rate thereof vary after the temperature of the $Alq_3$ starts increasing in the inactive gas atmosphere until the evaporation process is finished and the $Alq_3$ is cooled. FIG. 6 shows the relationship between the temperature and evaporation ratio of the $Alq_3$ in the vacuum atmosphere and TPD represented by the following chemical formula:

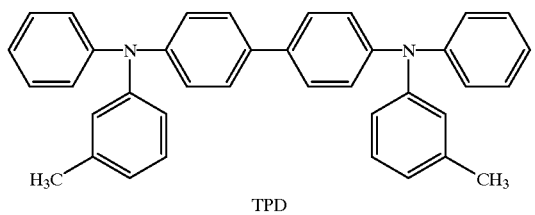

TPD

It can be seen from FIG. 6 that Alq emits a thin organic film material vapor at a temperature of about 300° C. and TPD emits a thin organic film material vapor at a temperature of about 230° C. A study of FIG. 5 shows that no $Alq_3$ vapor is produced in the inactive gas atmosphere even when it is heated to a temperature at which a thin organic film material vapor is produced in the vacuum atmosphere. Therefore, it can be understood that the production of a thin organic film material vapor can be controlled by the pressure of the inactive gas atmosphere.

It can be found from FIG. 5 that when the temperature of a thin organic film material is increased in the inactive gas atmosphere, no temperature overshooting is observed.

Figure 7:
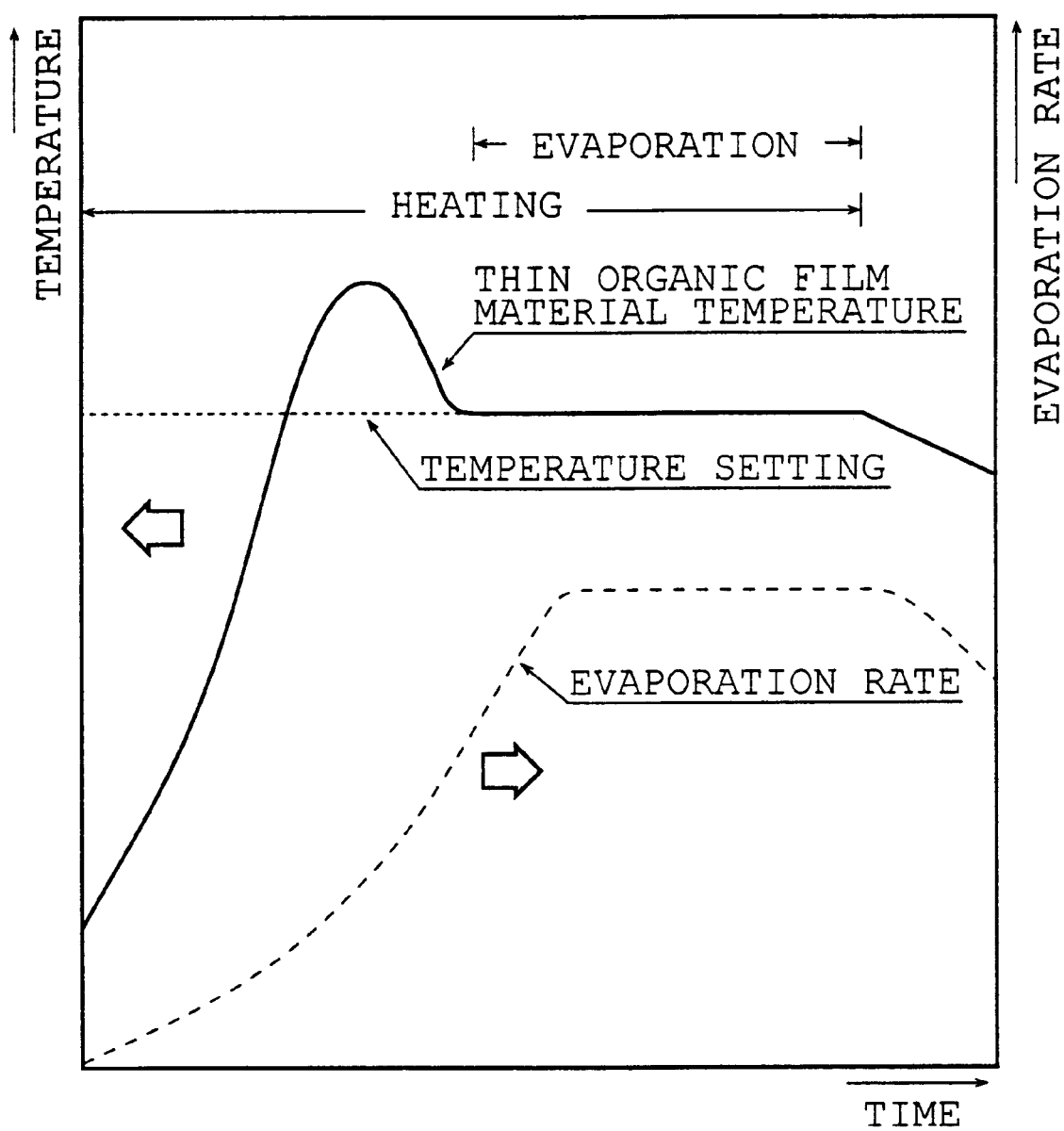
FIG. 7 is a graph showing the manner in which the temperature of a thin organic film material and the evaporation rate thereof vary with time when a thin organic film is formed by a conventional method.
Figure 8A:
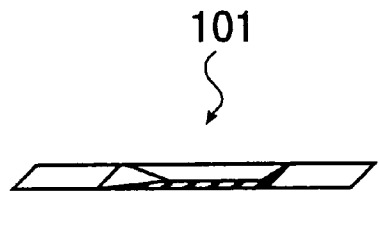
FIGS. 8A through 8E are views showing conventional evaporation sources.
Figure 8B:
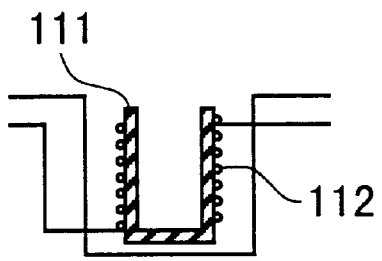
Figure 8C:
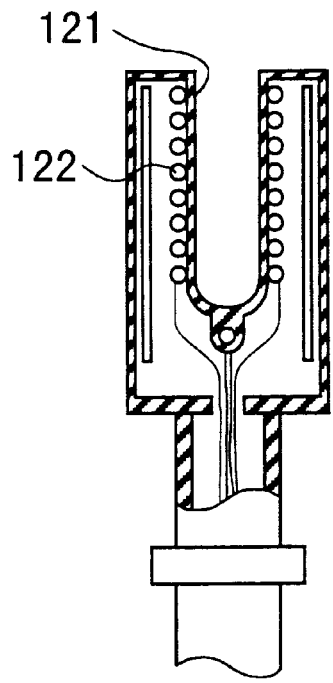
Figure 8D:
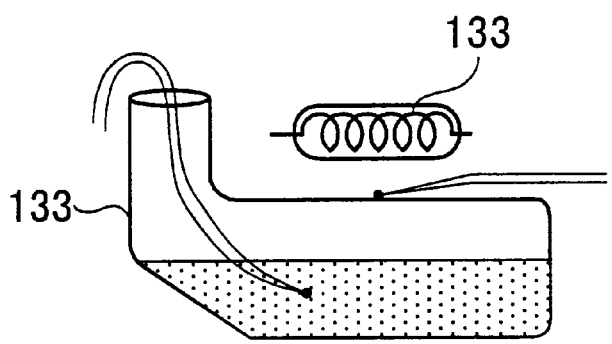
Figure 8E:
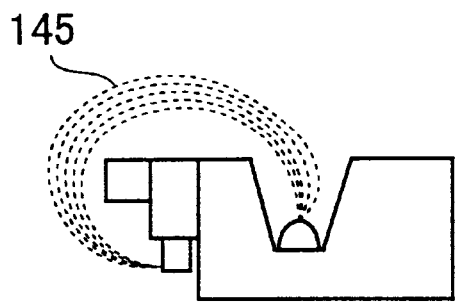

FIG. 7 shows the manner in which the temperature of $Alq_3$ and the evaporation rate thereof vary with time when a thin organic film is formed by a conventional method, i.e., not using an inactive gas. It can be seen from FIG. 7 that since the $Alq_3$ is thermally insulated in the vacuum when its temperature is increased, it is partially overheated, resulting a temperature overshooting. When the temperature of the $Alq_3$ is increased and reduced, an $Alq_3$ vapor which does not contribute to the formation of a thin organic film is produced in a large amount.

Figure 3:
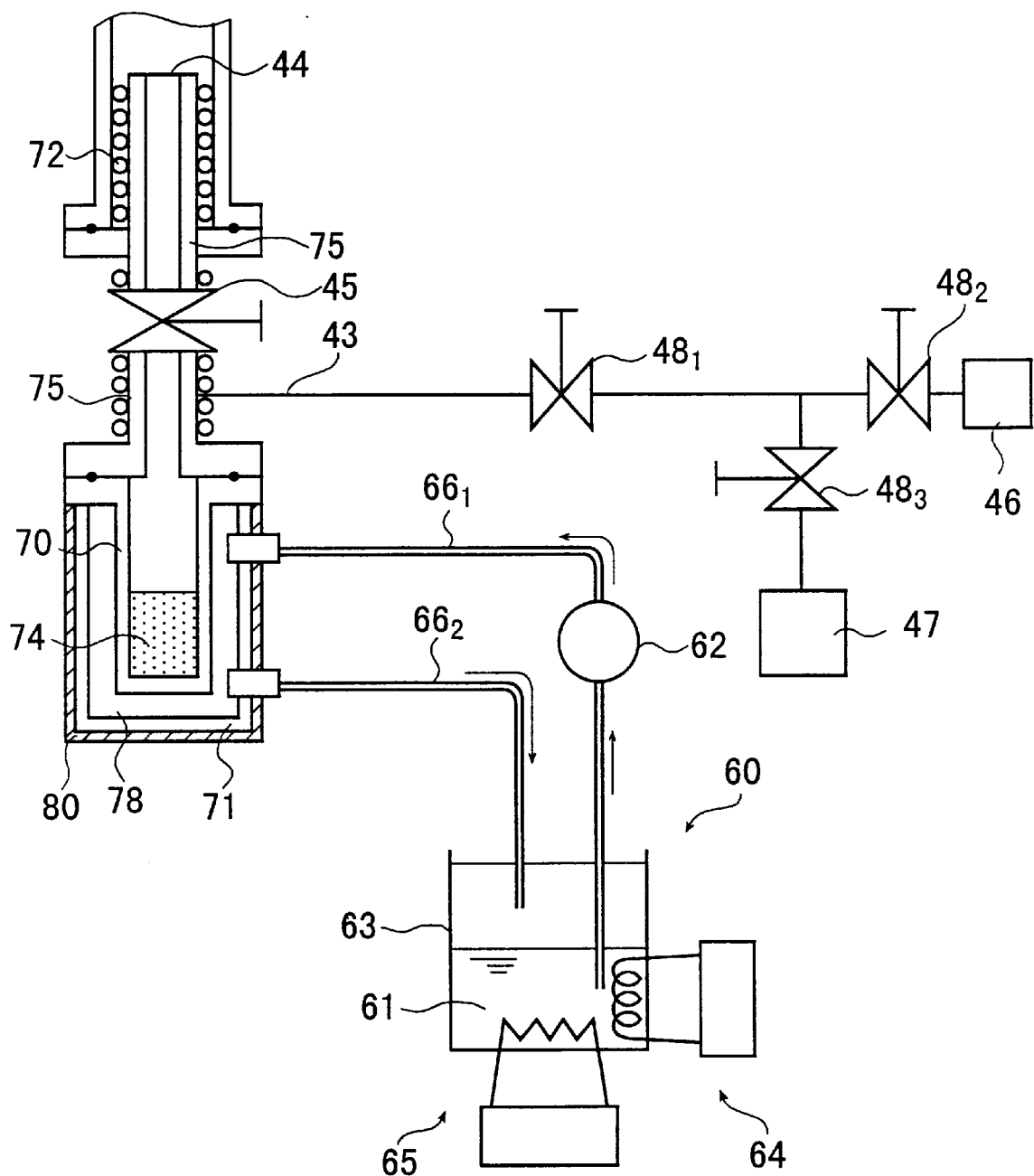
FIG. 3 is a schematic cross-sectional view of an organic material evaporation source according to another embodiment of the present invention.

FIG. 3 shows an organic material evaporation source 42 according to another embodiment of the present invention, which is suitable for heating and cooling a thin organic film material in the form of a liquid.

As shown in FIG. 3, the organic material evaporation source 42 is of the oil-bath type for controlling the temperature of a thin organic film material, i.e., heating and cooling a thin organic film material, with a liquid heating medium. The organic material evaporation source 42 may be used in place of the organic material evaporation sources $12_1$, $12_2$ in the evaporation apparatus 10 shown in FIG. 1.

The organic material evaporation source 42 is particularly suitable for keeping a thin organic film material at a constant temperature in the temperature range from −20° C. to 180° C. for thereby evaporating the thin organic film material. The organic material evaporation source 42 generally comprises a casing 71, a container 70, and a heating medium source 60.

The container 70 is disposed in the casing 71, jointly making up a double-walled structure having a heating medium circulatory path 78 defined between the container 70 and the casing 71. The casing 71 is surrounded by a heat insulating member 80. The heating medium source 60 comprises an oil bath 63, a heater 65, and an immersed cooler 64. The oil bath 63 contains a heating medium 61 which comprises silicone oil that can be heated by the heater 65 or cooled by the immersed cooler 64.

A supply pipe $66_1$ has a tip end placed in the heating medium 61, and a circulation pump 62 is connected in the supply pipe $66_1$. When the circulation pump 62 is actuated, it draws the heating medium 61 from the oil bath 63, and supplies the heating medium 61 through the supply pipe $66_1$ into the heating medium circulatory path 78. After a heat exchange is carried out between the heating medium 61 and a thin organic film material 74 in the container 70, the heating medium 61 is discharged from the heating medium circulatory path 78 through a discharge pipe $66_2$, and flows back to the oil bath 63.

The container 70 has an upper end hermetically joined to a lower end of a vapor outlet pipe 75, which has an outlet port 44 in its upper end that is open into a vacuum chamber (not shown in FIG. 3). A thin organic film material vapor produced from the thin organic film material 74 in the container 70 flows through the vapor outlet pipe 75 and is discharged through the outlet port 44 into the vacuum chamber.

The vapor outlet pipe 75 has an on-off valve 45 for controlling the passage of a gas therethrough. To the vapor outlet pipe 75 between the on-off valve 45 and the container 70, there is connected an end of a gas pipe 43 whose opposite end is connected to a gas container 46 filled with an inactive gas such as a nitrogen gas, an argon gas, or the like. The gas pipe 43 has a pair of gas valves $48_1$, $48_2$. The gas pipe 43 is branched between the gas valves $48_1$, $48_2$ into a branch pipe that has a gas valve $48_3$ and is connected to a vacuum pump 47.

The thin organic film material 74 contained in the container 70 comprises a liquid thin organic film material such as MDA(4,4'-diaminodiphenylmethane) represented by the following chemical formula:

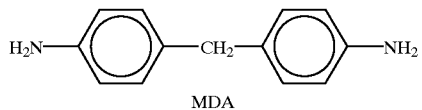

MDA or MDI (4,4'-diphenylmethane diisocyanate) represented by the following chemical formula:

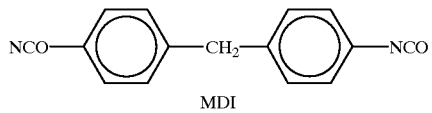

MDI

The organic material evaporation source 42 operates as follows:

The on-off valve 45 and the gas valve $48_2$ connected to the gas container 46 are closed, and the vacuum pump 47 is actuated. When the gas valves $48_1$, $48_3$ are opened, the container 70 is evacuated to place the thin organic film material 74 in a vacuum atmosphere.

The circulation pump 62 is actuated to heat the thin organic film material 74 up to a temperature at which no thin organic film material vapor is produced in the vacuum atmosphere. The thin organic film material 74 is thus degassed.

Then, the gas valve $48_3$ is closed, and the gas valve $48_2$ is opened, introducing the inactive gas from the gas container 46 through the gas pipe 43 into the container 70, thus placing the thin organic film material 74 in an inactive gas atmosphere.

After an inactive gas atmosphere having a pressure ranging from 1.33 Pa to $2.0 \times 10^3$ Pa (0.1 to 15.0 Torr) is developed in the container 70, the gas valves $48_1$, $48_2$ are closed, and the heating medium 61 is heated by the heater 65 and introduced into the heating medium circulatory path 78. In the heating medium circulatory path 78, the heating medium 61 flows while in contact with the outer circumferential and bottom surfaces of the container 70 for uniformly heating the container 70 and hence the thin organic film material 74 contained therein.

When the temperature of the heating medium 61 is increased at a predetermined rate, the temperature of the thin organic film material 74 is also increased at a corresponding rate.

Since the thin organic film material 74 is placed in the inactive gas atmosphere having the above pressure, the thin organic film material 74 is not evaporated even when heated to a temperature at which it would otherwise be evaporated under a lower pressure (in a vacuum atmosphere).

When the thin organic film material 74 is stabilized at its evaporation temperature, the valves $48_1$, $48_3$ are opened, with the valve $48_2$ remaining closed, and the vacuum pump 47 is actuated to evacuate the container 70. The pressure in the atmosphere around the thin organic film material 74 in the container 70 is lowered, causing the thin organic film material 74 to produce a vapor.

When the atmosphere of the container 70 is stabilized under a predetermined pressure, the on-off valve 45 is opened to permit the vapor of the thin organic film material 74 to flow from the container 70 through the vapor outlet pipe 75 and the outlet port 44 into the vacuum chamber.

The vapor outlet pipe 75 is surrounded by a microheater 72 for controlling the temperature of the vapor outlet pipe 75 independently of the temperature of the heating medium 61. For emitting a vapor from the thin organic film material 74, the microheater 72 is energized in advance to heat the vapor outlet pipe 75 to a temperature higher than the temperature of the thin organic film material 74.

Since the vapor outlet pipe 75 has been heated, the vapor of the thin organic film material 74 is not cooled when the thin organic film material 74 flows through the vapor outlet pipe 75. Therefore, the thin organic film material 74 will not be deposited in the vapor outlet pipe 75, and the on-off valve 45 is prevented from being clogged.

After the interior of the vacuum chamber is stabilized under a pressure of $1.33 \times 10^{-4}$ Pa ($1.0 \times 10$ Torr), the same as the case of evaporation apparatus 10 in FIG. 1 an evaporation, source shutter positioned above the outlet port 44 is opened, and a stable discharge of the vapor of the thin organic film material 74 is confirmed by a film thickness monitor positioned above the outlet port 44. Thereafter, a substrate shutter is opened to start depositing a thin organic film on the surface of a glass substrate.

After a thin organic film is deposited to a desired thickness, the on-off valve 45 is closed, blocking the vapor of the thin organic film material 74 against ingress into the vacuum chamber. The inactive gas is introduced into the container 70, and the cooler 64 is actuated to lower the temperature of the heating medium 63. Since the inactive gas is introduced into the container 70, increasing the pressure in the container 70, the emission of a vapor from the thin organic film material 74 is prevented, and hence the thin organic film material 74 is cooled without being evaporated.

After the thin organic film is deposited on the surface of the glass substrate, the glass substrate is replaced with a next glass substrate, which will start being processed for the deposition of a thin organic film thereon in the same manner as described above.

The formation of a single-layer thin organic film on an object has been described above with respect to the organic material evaporation source 42 shown in FIG. 3. However, a plurality of organic material evaporation sources for forming a multiple-layer thin organic film on an object may be employed such that a thin organic film material contained in each of the organic material evaporation sources is placed in an inactive gas atmosphere when the temperature thereof is increased and reduced.

The thin organic film material may be in the form of a solid or a liquid. If the thin organic film material is powdery, then since an inactive gas enters between particles of the powdery thin organic film material and acts as a heating medium, the rate at which the temperature of the thin organic film material is increased and reduced is increased, increasing the ability of the thin organic film material to be uniformly heated.

If the thin organic film material is in the form of a liquid, then since the temperature thereof is increased and reduced by the heating medium, the efficiency of a heat exchange is high. When the temperature of the thin organic film material is increased, as the temperature of thin organic film material is not higher than that of a heating medium, the thin organic film material will not be subject to bumping. The heating medium may be a gas as well as a liquid such as silicone oil.

While a nitrogen gas has been employed as the inactive gas in the above embodiments, another gas may be employed insofar as it does not react with thin organic film materials.

According to the present invention, as described above, a thin organic film material does not emit a vapor when its temperature is increased and reduced, and the rate at which the temperature of the thin organic film material is increased and reduced is increased.

Since temperature controllability of the thin organic film material is improved to prevent a temperature overshooting, the thin organic film material is prevented from bumping.

Furthermore, because the ability of the thin organic film material to be uniformly heated is increased, the rate at which a vapor of the thin organic film material is produced is stabilized within a short period of time.

Although certain preferred embodiments of the present invention have been shown and described in detail, it should be understood that various changes and modifications may be made therein without departing from the scope of the appended claims.

What is claimed is:

1. An organic material evaporation source comprising:

a container for containing a thin organic film material therein;

an outlet port;

an on-off valve connected between said container and said outlet port, said on-off valve being openable for connecting an interior atmosphere in said container to an exterior atmosphere outside of said container through said outlet port, and closable for disconnecting the interior atmosphere in said container from the exterior atmosphere outside of said container; and an evacuating system connected to said container, for selectively evacuating said container while said on-off valve is being closed.

2. An organic material evaporation source according to claim 1, further comprising:

a gas supply system connected to said container, for introducing a gas into said container while said on-off valve is being closed.

3. An organic material evaporation source according to claim 1, further comprising:

heating means disposed between said container and said outlet port across said on-off valve, for heating a passage from said container to said outlet port across said on-off valve.

4. An organic material evaporation source according to claim 2, further comprising:

at least a heating means disposed between said container and said outlet port across said on-off valve, for heating a passage from said container to said outlet port across said on-off valve.

5. An organic material evaporation source comprising:

a container for containing a liquid thin organic film material therein;

an outlet port;

a heating medium circulatory path for passing a heating medium therethrough, said heating medium circulatory path being disposed around said container;

an on-off valve connected between said container and said outlet port, said on-off valve being openable for connecting an interior atmosphere in said container to an exterior atmosphere outside of said container through said outlet port, and closable for disconnecting the interior atmosphere in said container from the exterior atmosphere outside of said container; and an evacuating system connected to said container, for selectively evacuating said container while said on-off valve is being closed.

6. An organic material evaporation source according to claim 5, further comprising:

a gas supply system connected to said container, for introducing a gas into said container while said on-off valve is being closed.

7. An organic material evaporation source according to claim 5, further comprising:

a heating medium source for controlling the temperature of said heating medium to heat or cool said liquid thin organic film material contained in said container.

8. An organic material evaporation source according to claim 5, further comprising:

a casing disposed around said container;

said heating medium circulatory path being defined between said container and said casing.

9. An organic material evaporation source according to claim 5, further comprising:

a heat insulating member disposed around said casing.

10. An organic material evaporation source according to claim 5, further comprising:

a casing disposed around said container;

said heating medium circulatory path being defined between said container and said casing; and a heating medium source for controlling the temperature of said heating medium to heat or cool said liquid thin organic film material contained in said container.

11. An organic material evaporation source according to claim 5, further comprising:

a heating means disposed between said container and said outlet port across said on-off valve, for heating a passage from said container to said outlet port across said on-off valve.

* * * * *